(12) United States Patent
Bagheri et al.

(10) Patent No.: US 7,764,103 B2
(45) Date of Patent: Jul. 27, 2010

(54) PHASE ERROR CANCELLATION FOR DIFFERENTIAL SIGNALS

(75) Inventors: Mahdi Bagheri, Carlsbad, CA (US); Kaveh Moazzami, San Diego, CA (US); Filipp A. Baron, Carlsbad, CA (US); Mohammad E. Heidari, Vista, CA (US); Rahim Bagheri, Carlsbad, CA (US)

(73) Assignee: WiLinx Corporation, Carlsbad, CA (US)

( * ) Notice: Subject to any disclaimer, the term of this patent is extended or adjusted under 35 U.S.C. 154(b) by 143 days.

(21) Appl. No.: 12/197,894

(22) Filed: Aug. 25, 2008

(65) Prior Publication Data

US 2010/0045404 A1 Feb. 25, 2010

(51) Int. Cl.
*H03H 11/16* (2006.01)
*H03K 3/00* (2006.01)
*H03K 5/13* (2006.01)

(52) U.S. Cl. .................. 327/233; 327/551; 327/552

(58) Field of Classification Search ................ 327/233, 327/551, 552
See application file for complete search history.

(56) References Cited

U.S. PATENT DOCUMENTS

2004/0127172 A1* 7/2004 Gierkink et al. ............... 455/91

* cited by examiner

*Primary Examiner*—Lincoln Donovan
*Assistant Examiner*—Daniel Rojas
(74) *Attorney, Agent, or Firm*—Chad R. Walsh; Fountainhead Law Group PC

(57) ABSTRACT

In one embodiment, the present invention includes an electronic circuit comprising a first stage having a first differential inductive element and a second differential inductive element, and a second stage coupled to an output of the first stage, the second stage having a first differential inductive element and a second differential inductive element, wherein the first and second differential inductive elements of the first stage couple magnetically to generate a first phase error, wherein the first and second differential inductive elements of the second stage couple magnetically to generate a second phase error, and wherein the second phase error cancels the first phase error.

11 Claims, 3 Drawing Sheets

PHASE ERROR CANCELLATION FOR DIFFERENTIAL SIGNALS

CROSS REFERENCE TO RELATED APPLICATIONS

Not Applicable

BACKGROUND

The present invention relates to phase error, and in particular, to phase error cancellation for differential signals in a quadrature architecture.

Many electronic applications utilize differential signaling. For example, some applications may use differential signals at low voltage levels to save power while delivering a reliable signal. However, as signal frequencies increase, problems arise in the propagation of differential signals between different circuits of an electrical device. For example, delivering reliable differential signals in communication electronics becomes problematic when employing phase modulation techniques at frequencies of 1 Gigahertz or greater. In particular, a system employing quadrature amplitude modulation (QAM) has an in-phase (I) differential signal and a quadrature phase (Q) differential signal which need to maintain a 90 degree phase difference. The layout of differential signal lines may cause signals to interfere with each other and may cause phase differences in the propagation of the signals. This may cause overall degradation in the signal quality and limit the performance of the application.

Thus, there is a need for improved phase separation. The present invention solves these and other problems by providing phase error cancellation for differential signals.

SUMMARY

Embodiments of the present invention improve phase error for differential signals.

In one embodiment, the present invention includes an electronic circuit comprising a first stage having a first differential inductive element and a second differential inductive element, and a second stage coupled to an output of the first stage, the second stage having a first differential inductive element and a second differential inductive element, wherein the first and second differential inductive elements of the first stage couple magnetically to generate a first phase error, wherein the first and second differential inductive elements of the second stage couple magnetically to generate a second phase error, and wherein the second phase error cancels the first phase error.

In one embodiment, the first and second differential inductive elements in the first stage are arranged symmetrically and the first and second differential inductive elements in the second stage are arranged symmetrically.

In one embodiment, at least one differential inductive element is configured according to a first polarity and each remaining differential inductor is configured according to an opposite polarity.

In one embodiment, the first stage includes an in-phase differential signal and a quadrature differential signal, and wherein the in-phase differential signal is coupled across the first differential inductive element in the first stage and the quadrature signal is coupled across the second differential inductive element in the first stage, and wherein the second stage includes an in-phase differential signal and a quadrature differential signal received from the first stage, and wherein the in-phase differential signal is coupled across the first differential inductive element in the second stage and the quadrature signal is coupled across the second differential inductive element in the second stage.

In one embodiment, the first and the second inductive elements of the first stage match and have a first inductance value, wherein the first and the second inductive elements of the second stage match and have a second inductance value.

In one embodiment, the second inductance value is equal to the first inductance value.

In one embodiment, the second inductance value is not equal to the first inductance value.

In one embodiment, the first stage has a first distance between the first and the second inductive elements, wherein the second stage has a second distance between the first and the second inductive elements.

In one embodiment, the second distance is equal to the first distance.

In one embodiment, the second distance is not equal to the first distance.

In one embodiment, the first stage comprises matching first and second differential circuits, wherein the first inductive element is configured as a load for the first differential circuit and the second inductive element is configured as a load for the second differential circuit.

The following detailed description and accompanying drawings provide a better understanding of the nature and advantages of the present invention.

DETAILED DESCRIPTION

Described herein are techniques for phase error cancellation for differential signals. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
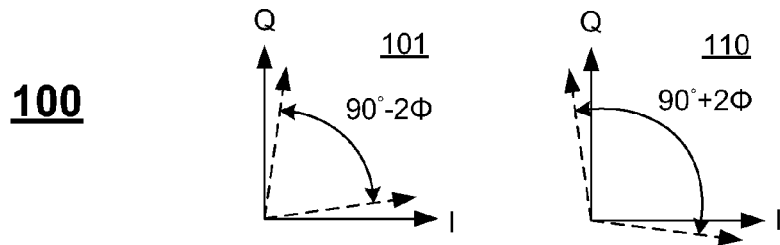
FIG. 1 illustrates a block diagram according to one embodiment of the present invention.
Figure 1:
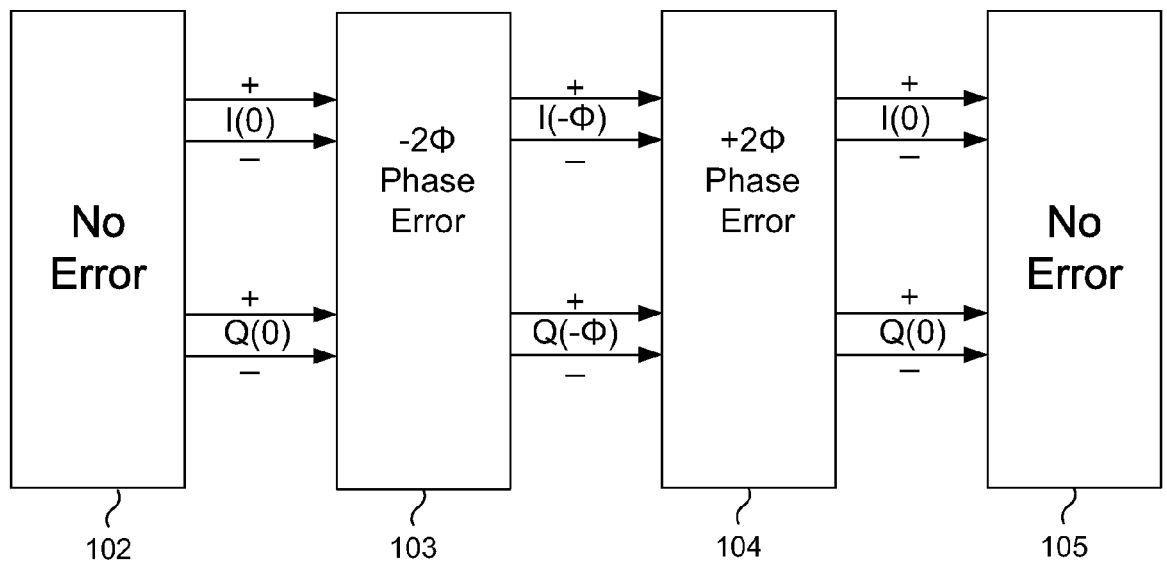

FIG. 1 illustrates a block diagram 100 according to one embodiment of the present invention. Block diagram 100 includes a first stage 102, a second stage 103, a third stage 104, and a fourth stage 105. The stages (102-105) may be quadrature stages having differential in-phase and differential quadrature signals (i.e. I and Q), for example. The stages (102-105) may include amplification, mixing, multiplexing, de-multiplexing, or a combination thereof.

Stage 102 generates in-phase and quadrature signals (i.e. I and Q) which have an initial phase, which may be considered zero phase error (0). Embodiments of the invention may introduce a first phase error in a first stage and a second phase error in a second subsequent stage, wherein the first phase error is equal but opposite to the second phase error so that the combined phase errors cancel. In one embodiment, symmetric differential inductors may be used and configures so that the first stage generates a first phase error and the second stage generates a second phase error that cancels the first phase error. For example, stage 103 introduces a phase error (−2ϕ) illustrated in graph 101. Graph 101 shows an example of the in-phase component (I) of the signal shifting positively (+ϕ) into the first quadrant and the quadrature phase component (Q) shifting negatively (−ϕ) into the first quadrant. The phase error (−2ϕ) may be caused by magnetically coupling the in-phase component (I) and the quadrature component (Q). This phase error (−2ϕ) may cause distortion when the signals are processed.

Stage 104 generates in-phase and quadrature signals which have cancelled the phase error (−2ϕ) introduced by stage 103. The cancellation occurs as a result of a positive phase error (+2ϕ) being introduced at stage 104. Graph 110 shows an example of the in-phase component (I) of the signal shifting negatively (−ϕ) out of the first quadrant and the quadrature phase component (Q) shifting positively (+ϕ) out of the first quadrant. The phase error (+2ϕ) may be caused by magnetically coupling the in-phase component (I) and the quadrature component (Q). This phase error cancellation may improve the signals by maintaining a 90 degree separation between the in-phase component (I) and the quadrature component (Q) as the signals are processed by multiple circuit stages. The phase separation (i.e. 90 degrees) results in a reduction of phase error at stage 105. Any number of stages may use the phase cancellation technique described herein. For example, stage 102 may provide a phase error (+2θ), stage 103 may provide a phase error of (+2ϕ−θ), stage 104 may provide a phase error (−ϕ−θ), and stage 5 may provide a phase error (−ϕ). This would result in an overall cancellation of errors in the chain of stages.

Figure 2:
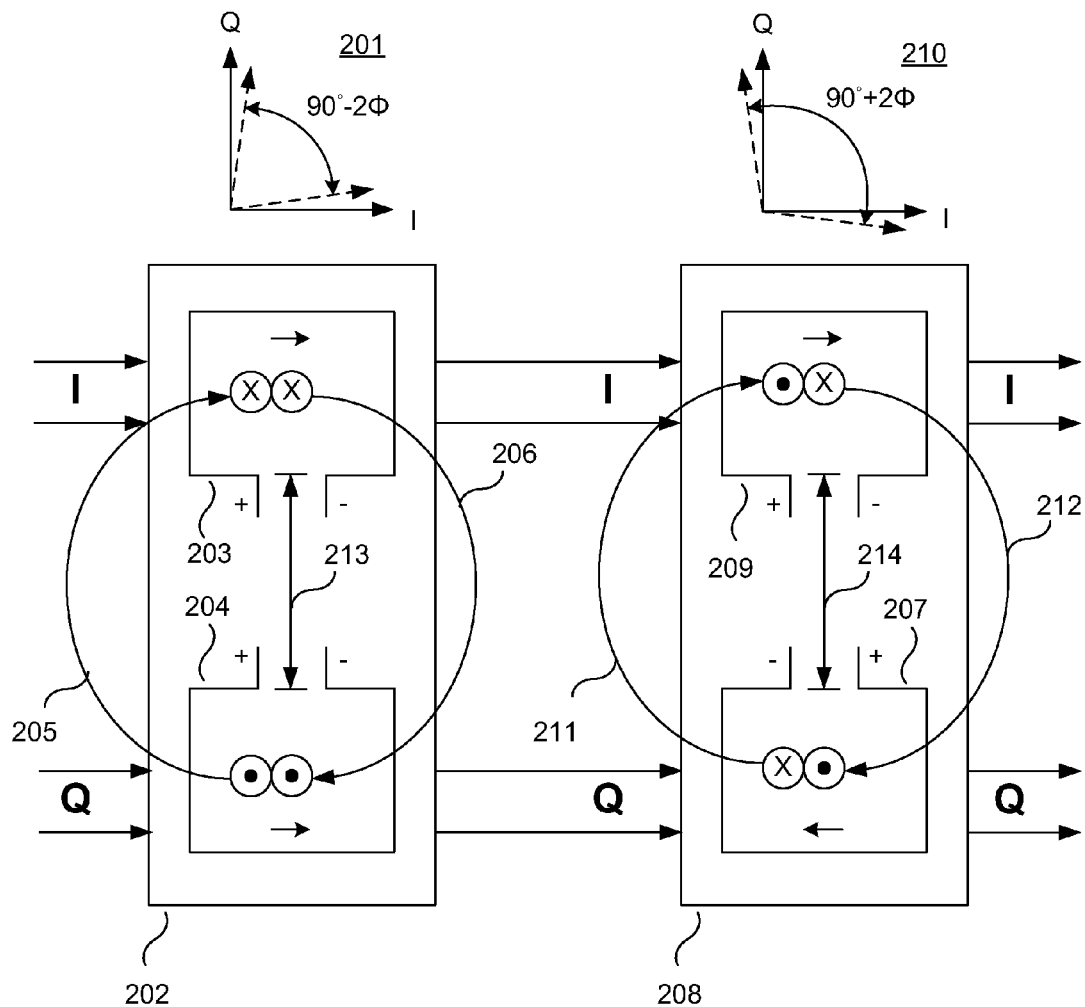
FIG. 2 illustrates phase error cancellation in an electronic device according to one embodiment of the present invention.

FIG. 2 illustrates two stages of an electronic device 200 according to one embodiment of the present invention. Electronic device 200 may be an integrated electronic circuit. Electronic device 200 includes stage 202 and stage 208. Each stage includes two differential inductive elements configured to cancel phase errors. Differential inductive elements (e.g., differential inductors) have first and second inputs, with a first input coupled to a first component of a differential signal and the second input coupled to a second component of a differential signal. In this example, stage 202 has a differential in-phase (I) signal component as an input. The differential in-phase component (I) energizes a differential inductor 203. Stage 202 has a differential quadrature phase (Q) signal component as an input. The differential quadrature phase component (Q) energizes a differential inductor 204.

The differential inductor 203 is configured to generate a magnetic field 206 into the loop (indicated by a X). For example, the positive in-phase signal component (I+) may be coupled to a first terminal of the inductor 203, and the negative in-phase signal component (I−) may be coupled to a second terminal of the inductor 203. When I+ is positive relative to I− a current will flow clockwise in the inductor loop and generate a magnetic field 206. Magnetic field 206 from inductor 203 couples to differential inductor 204 out of the loop (indicated by a ●). Similarly, differential inductor 204 is configured to generate a magnetic field 205 out of the loop (indicated by a ●). For instance, the positive quadrature signal component (Q+) may be coupled to a first terminal of the inductor 204, and the negative quadrature signal component (Q−) may be coupled to a second terminal of the inductor 204. When Q+ is positive relative to Q− a current will flow counterclockwise in the inductor loop and generate a magnetic field 205. Magnetic field 205 couples to differential inductor 203 into the loop (indicated by a X). Differential inductors 203 and 204 may be configured symmetrically with the inductor loops separated by a distance 213. The magnetic coupling together may result in overall phase error (−2ϕ) for stage 202. The phase error generated by the magnetic coupling may be a function of the spacing. For example, 100 um of spacing may cause about 1 degree of phase error in some applications.

Graph 201 illustrates the phase error contribution of the coupling of the two differential inductors of stage 202. The components (I and Q) have been shifted from their quadrature positions (90-2ϕ).

Stage 208 has a differential in-phase (I) signal component as an input. The differential in-phase component (I) energizes a differential inductor 209. Stage 208 has a differential quadrature phase component (Q) signal as an input. The differential quadrature phase component (Q) energizes a differential inductor 207.

The differential inductor 209 is configured to generate a magnetic field 212 into the loop (indicated by a X). Magnetic field 212 couples to differential inductor 207 out of the loop (indicated by a ●). Differential inductor 207 is configured to generate a magnetic field 211 into the loop (indicated by a X). Magnetic field 211 couples to differential inductor 209 out of the loop (indicated by a ●). The coupling together may result in overall phase error (+2ϕ) for stage 208.

Graph 210 illustrates the phase error contribution of the coupling of the two differential inductors of stage 208. The components (I and Q) have been shifted by +2ϕ. Differential inductors 207 and 209 may be configured symmetrically with the inductor loops separated by a distance 214. The magnetic coupling together may result in overall phase error (+2ϕ) for stage 208. The overall result is that the phase error introduced by stage 208 (+2ϕ) has cancelled the phase error introduced by stage 202 (−2ϕ). The phase difference between the quadrature components (I and Q) is now 90 degrees.

The distance 213 between the differential inductor 203 and 204 may be adjusted to change the amount of magnetic coupling. Similarly, a distance 214 between the differential inductor 209 and 207 may be adjusted to change the amount of magnetic coupling. By adjusting these distances the amount of phase error associated with the magnetic coupling may be changed. For example, the distance 214 may be 80 micrometers and the distance 213 may be 100 micrometers. This adjustment in error may be due to other sources of phase error introduced at stage 202 or some previous stage. This adjustment may also be associated with the inductor values used in stages 202 and 208. Other design criterion may inhibit the inductors from using the same differential inductor value in each stage.

The amount of phase shift may also be adjusted by changing the corresponding values of the differential inductors (203, 204, 207, and 209). For example, differential inductor 203 and 204 may have a value of ½ nH. The gain requirements may require the inductor 207 and 209 to have a value of ¼ nH. In this example, stage 202 would have more coupling than stage 208 and therefore have more phase shift associated with the amount of coupling. This reduction in value of differential inductance between the stages may be required due to other sources of phase error or design criterion such as gain, for example. Accordingly, if larger inductors are used, the spacing between the symmetric inductors may be increased, and if smaller inductors are used, the spacing between the symmetric inductors may be decreased so that the combined effect on the signals cancels phase errors introduced by the inductors.

The stages (202, 208) may be differential stages in which the inductive elements (203, 204, 207, and 209) may function as loads. For example, the differential inductors may be used as loads between a voltage reference (e.g., ground) and a differential pair of transistors. The differential inductors may have a center tap to the voltage reference and the other two terminals may be the output of the differential stage, for example. The differential inductor value may determine the overall gain of the stage. In an I/Q application, inductors 203 and 204 and inductors 207 and 209 are coupled to symmetric circuits for processing the I and Q signals. The transistors coupled to drive the inductors may have similar values and may be in close proximity to one another due to layout considerations such as propagation delay.

Figure 3:
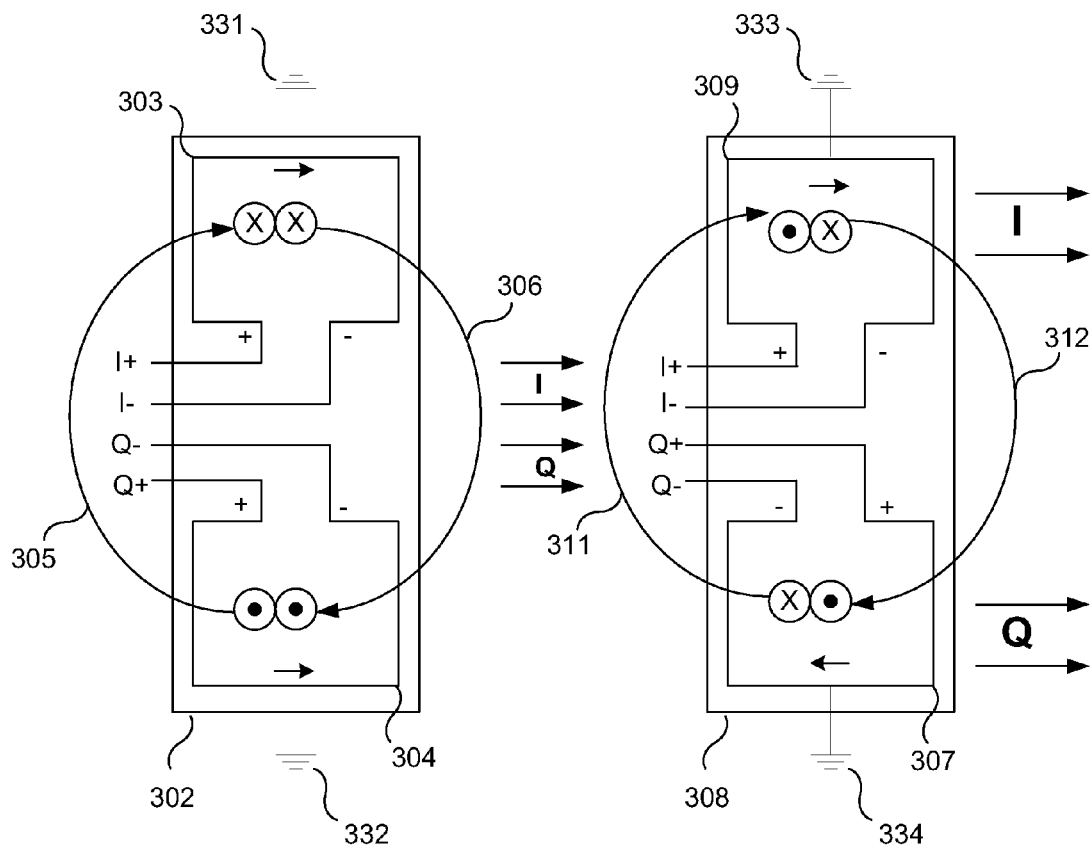
FIG. 3 illustrates phase error cancellation using differential inductors according to one embodiment of the present invention.

FIG. 3 illustrates phase error cancellation using differential inductors according to one embodiment of the present invention. In this example, a first stage 302 includes a first differential inductor 303 coupled to receive +/− I signals and a second differential inductor 304 coupled to receive +/− Q signals. Inductor 303 comprises a loop with a first half loop having an input coupled to I+ and a second half loop having an input coupled to I−. The centerpoint in the loop is coupled to a voltage reference, which is ground 331 in this example. The inductor is thereby configured to generate a clockwise current in the loop when I+ is greater than I−. Similarly, inductor 304 comprises a loop with a first half loop having an input coupled to Q+ and a second half loop having an input coupled to Q−. The centerpoint in the loop is coupled to ground 332 in this example. The inductor is thereby configured to generate a counterclockwise current in the loop when Q+ is greater than Q−. Inductors 303 and 304 are arranged symmetrically. For example, on a silicon substrate the inductors may be patterned on a metallization layer to have the same dimensions that are aligned and separated by a predetermined distance to control the phase error. Using this configuration, the stage will generate a net negative phase error.

In a similar manner, a second stage 308 includes a first differential inductor 309 coupled to receive +/− I signals and a second differential inductor 307 coupled to receive +/− Q signals. Inductor 309 comprises a loop with a first half loop having an input coupled to I+ and a second half loop having an input coupled to I−. The centerpoint in the loop is coupled to a ground 333. The inductor is thereby configured to generate a clockwise current in the loop when I+ is greater than I−. Similarly, inductor 307 comprises a loop with a first half loop having an input coupled to Q+ and a second half loop having an input coupled to Q−. The centerpoint in the loop is coupled to ground 334. The inductor is thereby configured to generate a clockwise current in the loop when Q+ is greater than Q−, which is opposite the direction of the current in the previous stage inductor so that the magnetic fields are opposite and the phase error introduced is opposite. Accordingly, in this example, one differential inductor is configured according to a first polarity (e.g., a counterclockwise current when Q+ is greater than Q−) and each remaining differential inductor is configured according to an opposite polarity (e.g., a clockwise current) to cancel phase error. Additionally, inductors 307 and 309 may be arranged symmetrically on a silicon substrate with the inductors patterned on a metallization layer to have the same dimensions and be aligned and separated by a predetermined distance to control the phase error. Using this configuration, the stage 308 will generate a net positive phase error. The inductor values and distances may be configured so that the net phase error of the two stages is approximately zero.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. An electronic circuit comprising:
   a first stage having a first differential inductive element and a second differential inductive element; and
   a second stage coupled to an output of the first stage, the second stage having a first differential inductive element and a second differential inductive element,
   wherein the first and second differential inductive elements of the first stage couple magnetically to generate a first phase error,
   wherein the first and second differential inductive elements of the second stage couple magnetically to generate a second phase error, and
   wherein the second phase error cancels the first phase error.

2. The electronic circuit of claim 1 wherein the first and second differential inductive elements in the first stage are arranged symmetrically and the first and second differential inductive elements in the second stage are arranged symmetrically.

3. The electronic circuit of claim 1 wherein at least one differential inductive element is configured according to a first polarity and each remaining differential inductor is configured according to an opposite polarity.

4. The electronic circuit of claim 1 wherein the first stage includes an in-phase differential signal and a quadrature differential signal, and wherein the in-phase differential signal is coupled across the first differential inductive element in the first stage and the quadrature signal is coupled across the second differential inductive element in the first stage, and wherein the second stage includes an in-phase differential signal and a quadrature differential signal received from the first stage, and wherein the in-phase differential signal is coupled across the first differential inductive element in the second stage and the quadrature signal is coupled across the second differential inductive element in the second stage.

5. The electronic circuit of claim 1 wherein the first and the second inductive elements of the first stage match and have a first inductance value, wherein the first and the second inductive elements of the second stage match and have a second inductance value.

6. The electronic circuit of claim 5 wherein the second inductance value is equal to the first inductance value.

7. The electronic circuit of claim 5 wherein the second inductance value is not equal to the first inductance value.

8. The electronic circuit of claim 5 wherein the first stage has a first distance between the first and the second inductive elements, wherein the second stage has a second distance between the first and the second inductive elements.

9. The electronic circuit of claim 8 wherein the second distance is equal to the first distance.

10. The electronic circuit of claim 8 wherein the second distance is not equal to the first distance.

11. The electronic circuit of claim 1 wherein the first stage comprises matching first and second differential circuits, wherein the first inductive element is configured as a load for the first differential circuit and the second inductive element is configured as a load for the second differential circuit.

* * * * *